United States Patent
Lin

(10) Patent No.: US 7,385,311 B2
(45) Date of Patent: Jun. 10, 2008

(54) VOLTAGE CONTROLLER IMPLEMENTED IN A LOW OPERATION VOLTAGE DEVICE

(75) Inventor: Cheng-Nan Lin, Hsin-Chu (TW)

(73) Assignee: AMIC Technology Corporation, Hsin-Chu (TW)

( * ) Notice: Subject to any disclaimer, the term of this patent is extended or adjusted under 35 U.S.C. 154(b) by 314 days.

(21) Appl. No.: 11/279,558

(22) Filed: Apr. 12, 2006

(65) Prior Publication Data

US 2007/0152510 A1    Jul. 5, 2007

(30) Foreign Application Priority Data

Jan. 4, 2006    (TW)    ............................ 95100363 A

(51) Int. Cl.
*H02J 1/10*    (2006.01)

(52) U.S. Cl. .......................................................... 307/29
(58) Field of Classification Search .................... 307/29
See application file for complete search history.

(56) References Cited

U.S. PATENT DOCUMENTS 6,420,859 B1    7/2002    Tsai et al.

*Primary Examiner*—Robert L. Deberadinis
(74) *Attorney, Agent, or Firm*—Winston Hsu

(57) ABSTRACT

When a low operation voltage device is idle and a voltage of an external power supply is larger than a predetermined voltage, a transistor with a high threshold voltage is turned on to provide electric power to the low operation voltage device. When the low operation voltage device is operating and the voltage of the external power supply is not larger than the predetermined voltage, a transistor with a low threshold voltage is turned on to provide electric power to the low operation voltage device.

6 Claims, 14 Drawing Sheets

VOLTAGE CONTROLLER IMPLEMENTED IN A LOW OPERATION VOLTAGE DEVICE

BACKGROUND OF THE INVENTION

1. Field of the Invention

The present invention relates to a voltage controller, and more particularly, to a voltage controller implemented in a low operation voltage device.

2. Description of the Prior Art

Generally, an operating voltage of a low operation voltage device is smaller than a potential provided by an external power supply. Therefore, a voltage dropping circuit is designed to drop the potential of the external power supply to an allowable operating voltage range of the low operation voltage device. However, an input voltage and current provided to the low operation voltage device when the low operation voltage device is idle is smaller than that when the low operation voltage device is operating. Thus, the voltage dropping circuit must be designed to properly drop voltages according these different conditions.

When the low operation voltage device, taking a static random access memory (SRAM) for example, writes data or reads data, it requires a larger operating voltage. However, some rules of a memory specification indicate that the current flowing into the SRAM must be limited when the SRAM is idle. In this condition, the SRAM just needs a smaller voltage that is large enough to keep all the data stored in the memory. Therefore, when the SRAM is idle, the voltage dropping circuit can drop the potential of the external power supply to a much smaller voltage, and then provide the smaller voltage to the SRAM to keep the data. Since the SRAM requires a basic voltage to maintain data, when the SRAM is idle, it has to detect whether the received operating voltage is smaller than the basic voltage so as to prevent data stored in the memory from becoming inaccurate.

Please refer to FIG. 1, which shows a voltage controller 1 and a low operation voltage device 2 according to the prior art. The voltage controller 1 comprises a first transistor 12 and a second transistor 14, wherein a threshold voltage HV of the first transistor 12 is larger than a threshold voltage LV of the first transistor 14. The voltage controller 1 drops the potential of an external power supply VCC via the first transistor 12 or the second transistor 14, and the dropped voltage is provided to the low operation voltage device 2.

A drain of the first transistor 12 and a drain of the second transistor 14 are both coupled to the external power supply VCC, such as a battery; a source of the first transistor 12 and a source of the second transistor 14 are both coupled to a voltage input of the low operation voltage device 2; a gate of the first transistor 12 receives an idle signal STBY of the low operation voltage device 2; and a gate of the second transistor 14 receives an operating signal ACT of the low operation voltage device 2.

When the low operation voltage device 2 is operating, the operating signal ACT is high while the idle signal STBY is low, resulting in turning on the second transistor 14 and turning off the first transistor 12. The potential of the external power supply VCC is dropped by the second transistor 14, and thereby provides the voltage of (VCC−LV) to the low operation voltage device 2. On the contrary, when the low operation voltage device 2 is idle, the operating signal ACT is low while the idle signal STBY is high, resulting in turning off the second transistor 14 and turning on the first transistor 12. The potential of the external power supply VCC is dropped by the first transistor 12 with larger threshold voltage, and only provides the voltage of (VCC−HV) to the low operation voltage device 2. Thus, the prior art can drop different voltages according to different conditions.

However, the voltage controller 1 of the prior art has some disadvantages. Suppose that the low operation voltage device 2 is an SRAM with a 2-volt operating voltage when reading and writing data and a 0.8-volt basis operating voltage to maintain data, the external power supply is a battery with a maximum 3.6-volt voltage, the threshold voltage HV of the first transistor 12 is 1.2 volts, and the threshold voltage LV of the second transistor 14 is 0.7 volts.

If the low operation voltage device 2 switches from the idle status to the operation status, the input voltage power path of the low operation voltage device 2 must be switched. That is, the input voltage originally provided from the first transistor 12 should be provided from the second transistor 14 instead. Since the low operation voltage device 2 is a memory capable of reading and writing data, if the input voltage provided to the low operation voltage device 2 were not immediately increased from low potential to high potential, it might fail in reading or writing the first data bit.

For example, please refer to FIG. 2 and FIG. 3, which respectively show the low operation voltage device 2 idle and operating when the external power supply VCC is 2.7 volts. As shown in FIG. 2, when the low operation voltage device 2 is idle, the first transistor 12 drops the potential of the external power supply VCC down to 1.5 volts to be provided to the low operation voltage device 2. As shown in FIG. 3, when the low operation voltage device 2 is operating, the second transistor 14 drops the potential of the external power supply VCC down to 2 volts to be provided to the low operation voltage device 2. Therefore, the input voltage of the low operation voltage device 2 must be increased from 1.5 volts to 2 volts when transferring from the idle status to the operation status. The time for switching the power path might result in failing to read or store the first data bit.

The other possible way to fail to read or store the first data bit is as follows. Please refer to FIG. 4, which shows the low operation voltage device 2 idle when the potential of the external power supply is decreased to 2 volts. At this time, the low operation voltage device 2 receives the operating voltage of 0.8 volts, where the data stored in the memory can still be kept precisely. If the potential of the external power supply VCC is smaller than 2 volts, the data cannot be maintained precisely anymore. If reading or writing data is executed, the battery must be changed or be charged. Please refer to FIG. 5, which shows the potential of the external power supply VCC of FIG. 4 increased from 2 volts to 3.6 volts and the operation status entered. At this time, the input voltage of the low operation voltage device 2 is increased from 0.8 volts to 2.9 volts, which still requires a time to switch the power path, resulting in failing to read or store the first data bit.

In addition, please refer to FIG. 6, which shows the low operation voltage device 2 idle when the potential of the external power supply VCC is 3.6 volts. Since some rules of the memory specification limit the flowing current of the idle status, in FIG. 6, the low operation voltage device 2 receives 2.4 volts, which does not conform to the rules. If the threshold voltage of the first transistor 12 is increased to reduce the input current, when the first transistor 12 with increased threshold voltage is in the status of FIG. 4, the data cannot be stored precisely because the input voltage of the low operation voltage device 2 is smaller than 0.8 volts.

Thus, adjusting the threshold voltages of the voltage controller 1 of the prior art would limit the applications.

SUMMARY OF THE INVENTION

The claimed invention provides a voltage controller comprising a first transistor with a first threshold voltage, a second transistor with a second threshold voltage, a first logic circuit, and a second logic circuit. The first transistor has a drain coupled to a voltage source, and a source coupled to a voltage input of a low operation voltage device. The second threshold voltage of the second transistor is smaller than the first threshold voltage of the first transistor. The second transistor has a drain coupled to the voltage source and a source coupled to the voltage input of the low operation voltage device. The first logic circuit has an output coupled to a gate of the first transistor for turning on the first transistor when the low operation voltage device is idle and a value of the voltage source is larger than a predetermined voltage value. The second logic circuit has an output coupled to a gate of the second transistor for turning on the second transistor when the low operation voltage device is operating or the value of the voltage source is not larger than the predetermined voltage value.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
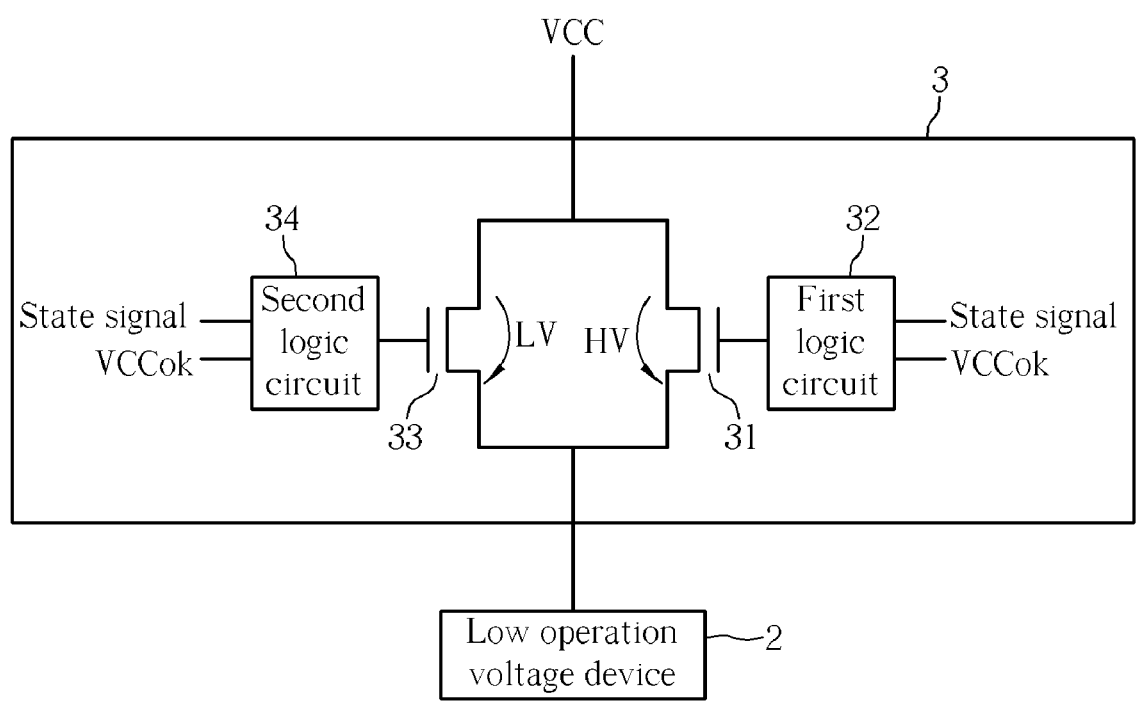
FIG. 7 shows a voltage controller of the present invention and the low operation voltage device.

Please refer to FIG. 7, which shows a voltage controller 3 of the present invention and the low operation voltage device 2. The voltage controller 3 of the present invention comprises a first transistor 31, a second transistor 33, a first logic circuit 32, and a second logic circuit 34, wherein a threshold voltage HV of the first transistor 31 is larger than a threshold voltage LV of the second transistor 33. The first logic circuit 32 and the second logic circuit 34 are coupled to a gate of the first transistor 31 and a gate of the second transistor 33, respectively. The present invention utilizes the first logic circuit 32 and the second logic circuit 34 to respectively control the first transistor 31 and the second transistor 33 to be turned on, so that the potential of the external power supply VCC can be dropped and then provided to the low operation voltage device 2.

The operations of the first logic circuit 32 and the second logic circuit 34 are as follows. The first logic circuit 32 and the second logic circuit 34 receive two types of signals. One is a state signal of the low operation voltage device 2, such as an idle signal STBT and an operating signal ACT. The other is a voltage signal VCCok indicating the potential of the external power supply VCC. When the potential of the external power supply VCC is larger than a predetermined voltage value, the voltage signal VCCok is high. On the contrary, when the potential of the external power supply VCC is not larger than the predetermined voltage value, the voltage signal VCCok is low.

When the low operation voltage device 2 is idle and the potential of the external power supply VCC is larger than the predetermined voltage value, the first logic circuit 32 turns on the first transistor 31, so that the low operation voltage device 2 receives the dropped voltage (VCC−HV) from the first transistor 31.

When the low operation voltage device 2 is operating or when the potential of the external power supply VCC is not larger than the predetermined voltage value, the second logic circuit 34 turns on the second transistor 33, so that the potential of the external power supply VCC is dropped by the second transistor 33, and then the dropped voltage (VCC−LV) is provided to the low operation voltage device 2.

Figure 8:
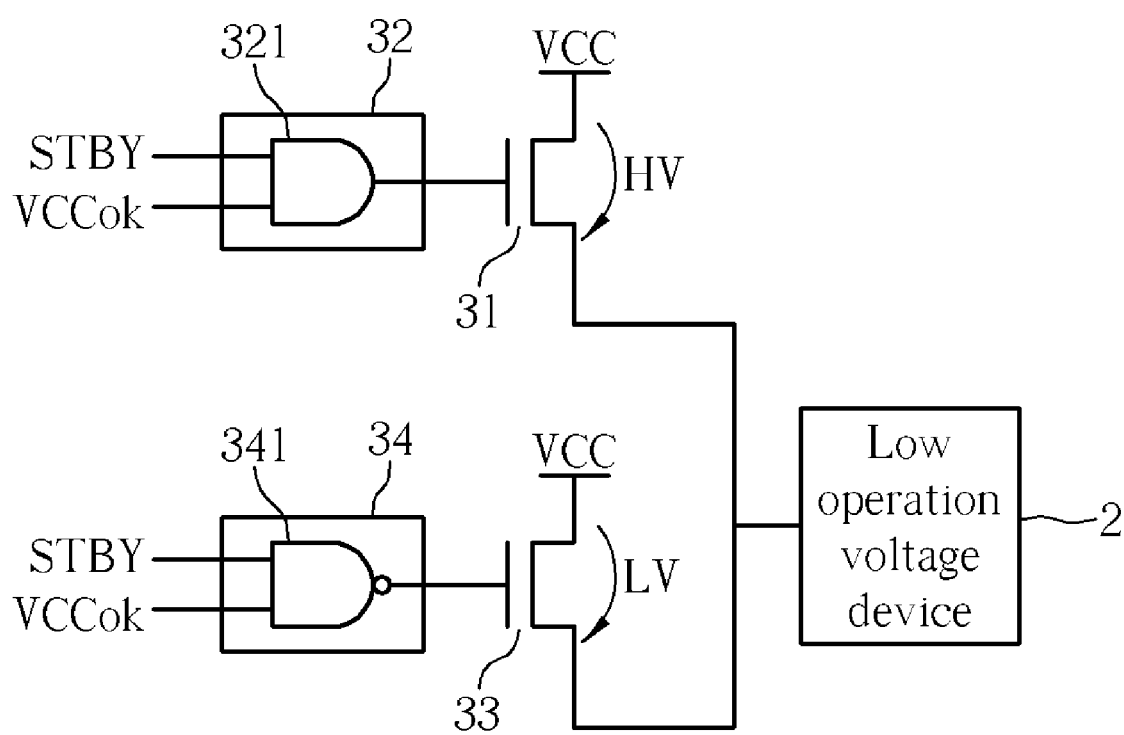
FIGS. 8 and 9 are embodiments of the voltage controller of FIG. 7.

The first logic circuit 32 and the second logic circuit 34 are designed according to the above definitions. Please refer to FIGS. 8 and 9, which show embodiments of the first logic circuit 32 and the second logic circuit 34 of FIG. 7. In FIG. 8, the first logic circuit 32 comprises an AND logic gate 321 having a first input for receiving the idle signal STBY of low operation voltage device 2, a second input for receiving the voltage signal VCCok of the external power supply VCC, and an output coupled to the gate of the first transistor 31. The second logic circuit 34 comprises a NAND logic gate 341 having a first input for receiving the idle signal STBY of low operation voltage device 2, a second input for receiving the voltage signal VCCok of the external power supply VCC, and an output coupled to the gate of the second transistor 33.

Figure 9:
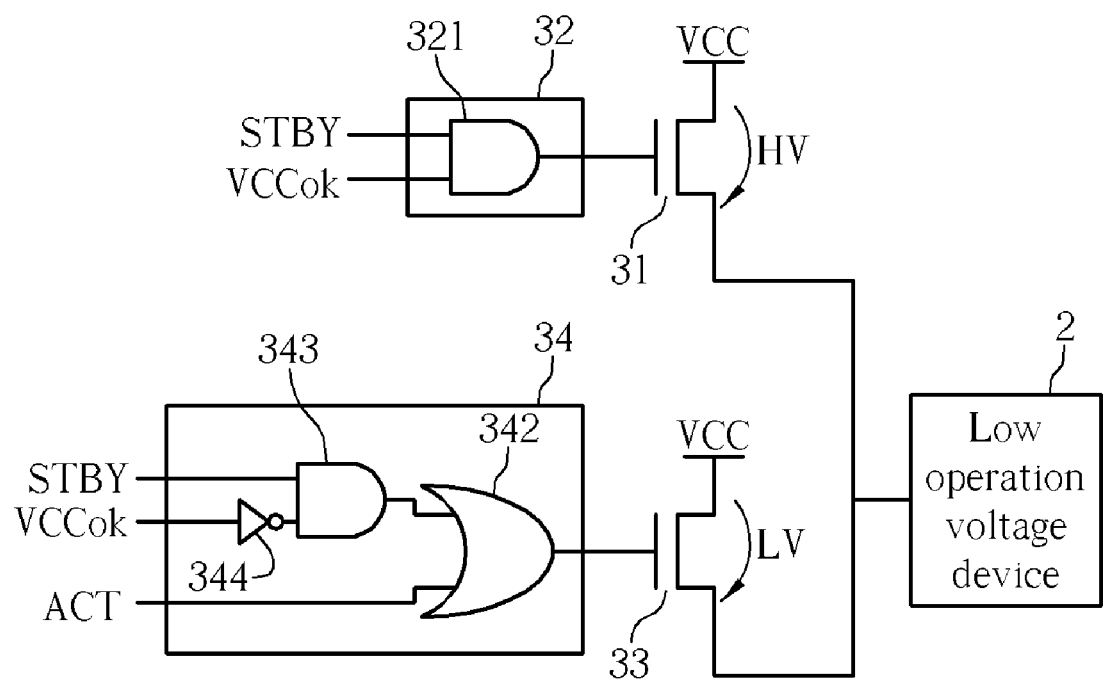

In FIG. 9, the second logic circuit 34 comprises an inverter 344, an AND logic gate 343, and an OR logic gate 342. An input of the inverter 344 receives the voltage signal VCCok of the external power supply VCC; the AND logic gate 343 has a first input for receiving an output signal of the inverter 344 and a second input for receiving the idle signal STBY of the low operation voltage device 2; the OR logic gate 342 has a first input for receiving an output signal of the AND logic gate 343, a second input for receiving the operating signal ACT of the low operation voltage device 2, and an output coupled to the gate of the second transistor 33.

The embodiments of the present invention are not limited by the embodiments in FIG. 8 and FIG. 9. For instance, receiving the idle signal STBY can be replaced by receiving the operating signal ACT with an inverter. Similarly, receiving the operating signal ACT can be replaced by receiving the idle signal STBY with an inverter.

The operation of the voltage controller 3 of the present invention is different from that of the prior art. The prior art switches the power paths only according to the status of the low operation voltage device 2. However, the present invention switches the power paths not only according to the status of the low operation voltage device 2, but according to the potential of the external power supply VCC. Therefore, the present invention can solve the failure of reading or storing the first data bit due to switching the power paths.

Suppose that the low operation voltage device 2 is an SRAM with a 2-volt operating voltage when reading and writing data and a 0.8-volt basis operating voltage to maintained data, the external power supply is a battery with a maximum voltage 3.6 volts, the threshold voltage HV of the first transistor 12 is 1.2 volts, and the threshold voltage LV of the first transistor 12 is 0.7 volts. When the potential of the external power supply VCC is larger than 3 volts (the predetermined voltage value), the voltage signal VCCok is high. On the contrary, the voltage signal VCCok is low.

Figure 10:
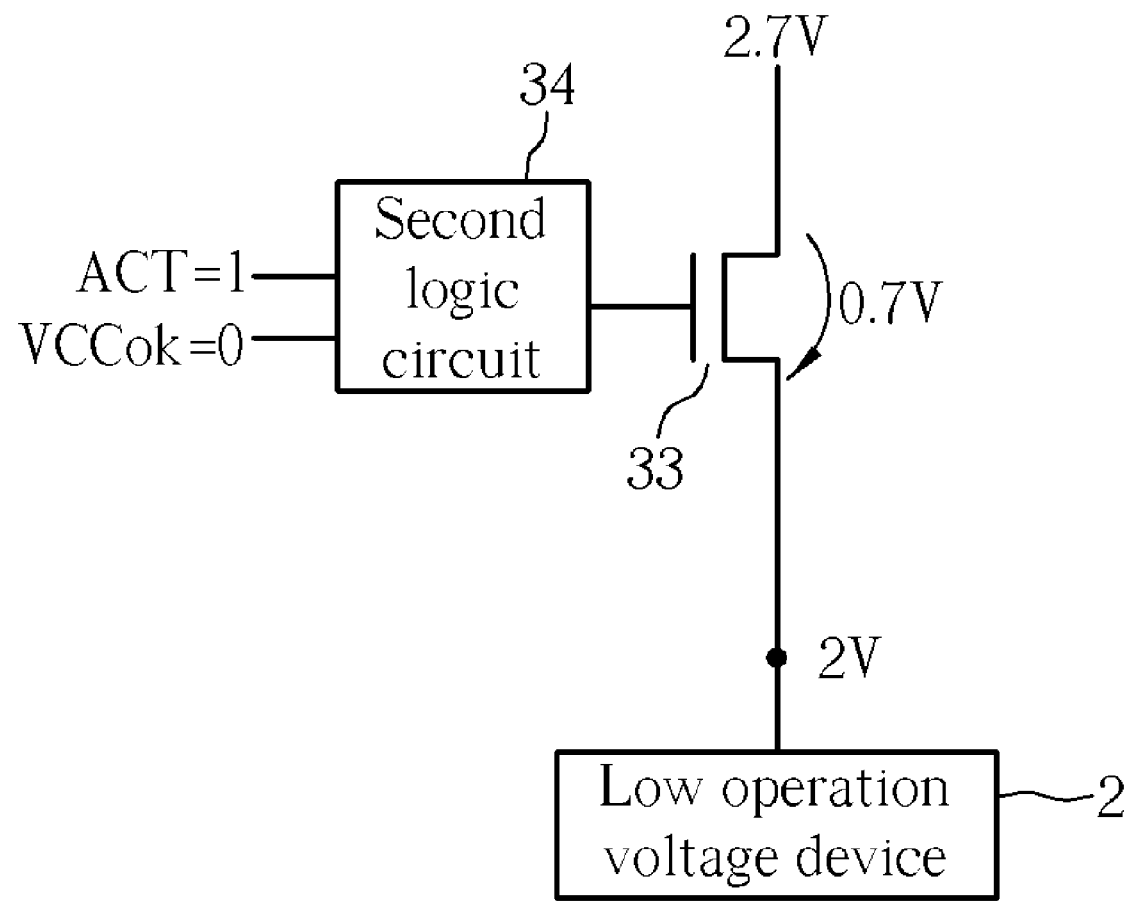
FIG. 10 and FIG. 11 respectively show the voltage controller of the present invention providing voltages to the low operation voltage device when the external power supply of FIG. 7 is at 2.7 volts.
Figure 11:
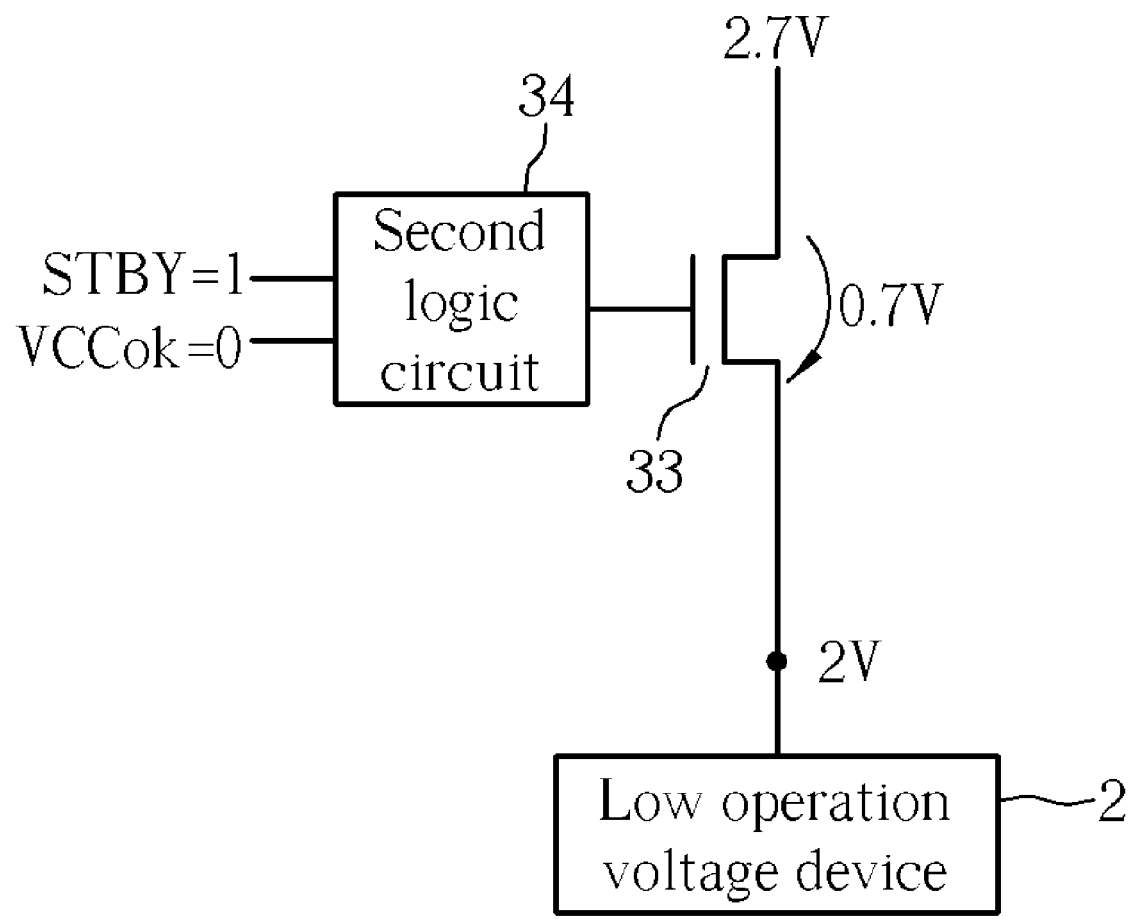

Please refer to FIG. 10 and FIG. 11, which respectively show the voltage controller 3 of the present invention providing voltages to the low operation voltage device 2 when the external power supply VCC is at 2.7 volts. In FIG. 10, the low operation voltage device 2 is operating and the potential of the external power supply VCC is smaller than 3 volts. In FIG. 11, the low operation voltage device 2 is idle and the potential of the external power supply VCC is smaller than 3 volts. In FIG. 10 and FIG. 11, the power paths are the same, where the second logic circuit 34 turns on the second transistor 33 to provide 2 volts to the low operation voltage device 2. Therefore, when the potential of the external power supply VCC is smaller than the predetermined voltage, the low operation voltage device 2 still receives 2 volts when transferring from the idle status to the operation status. In this way, the power path is the same in these two conditions, and thereby prevents the failure of reading or storing the first data bit due to switching the power path.

Figure 1:
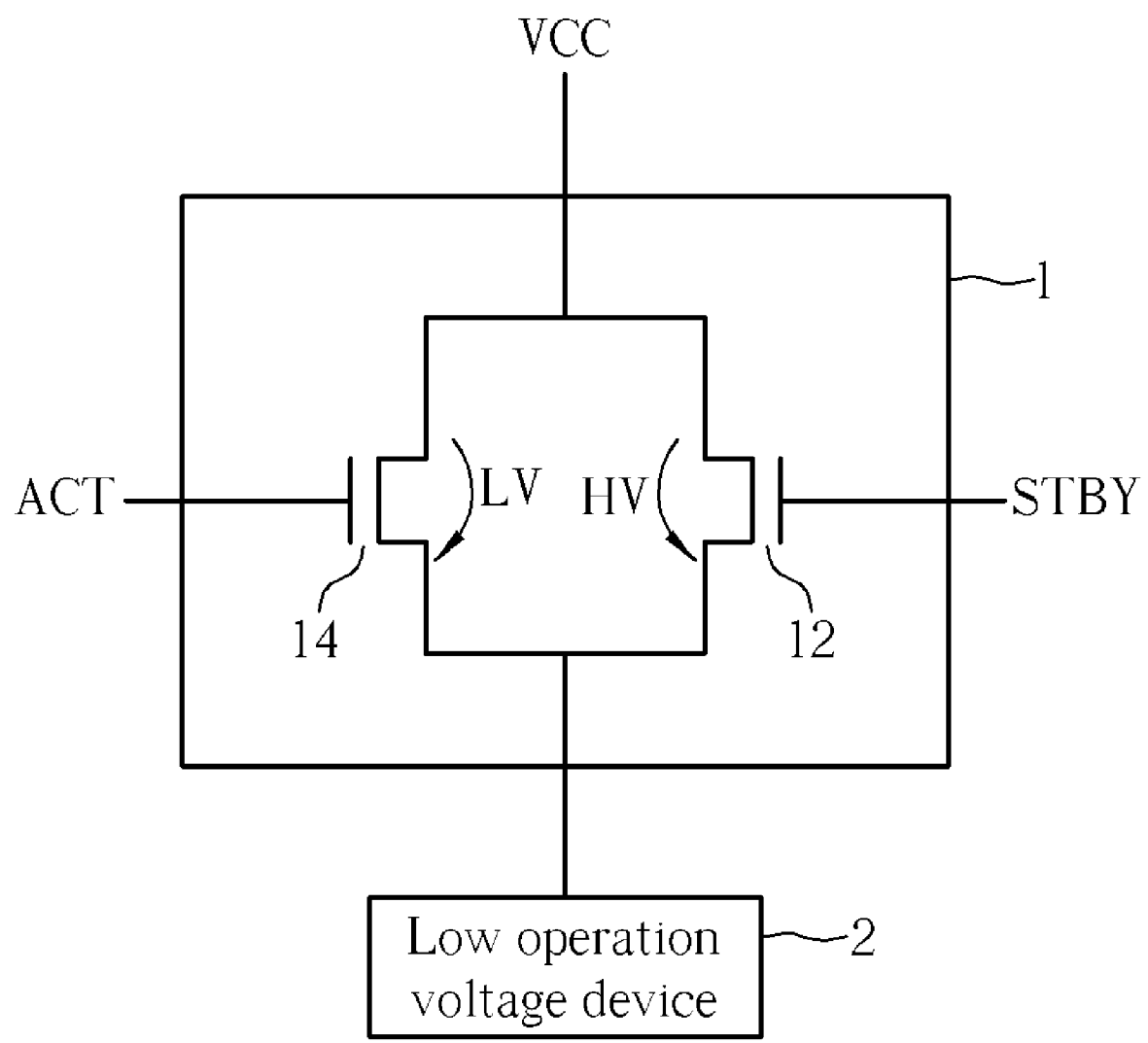
FIG. 1 shows a voltage controller and a low operation voltage device according to the prior art.
Figure 2:
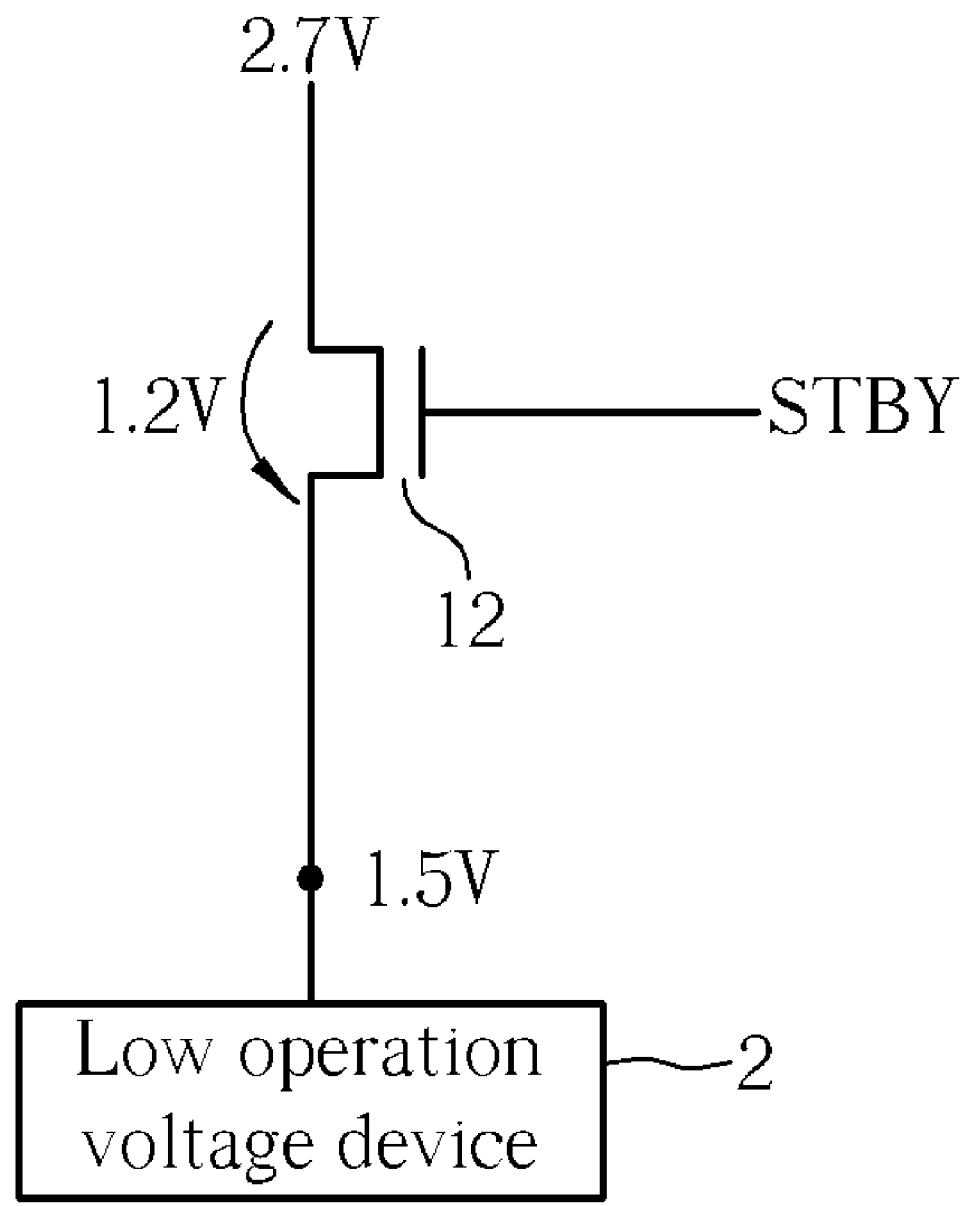
FIG. 2 and FIG. 3 respectively show the low operation voltage device idle and operating when the external power supply of FIG. 1 is 2.7 volts.
Figure 3:
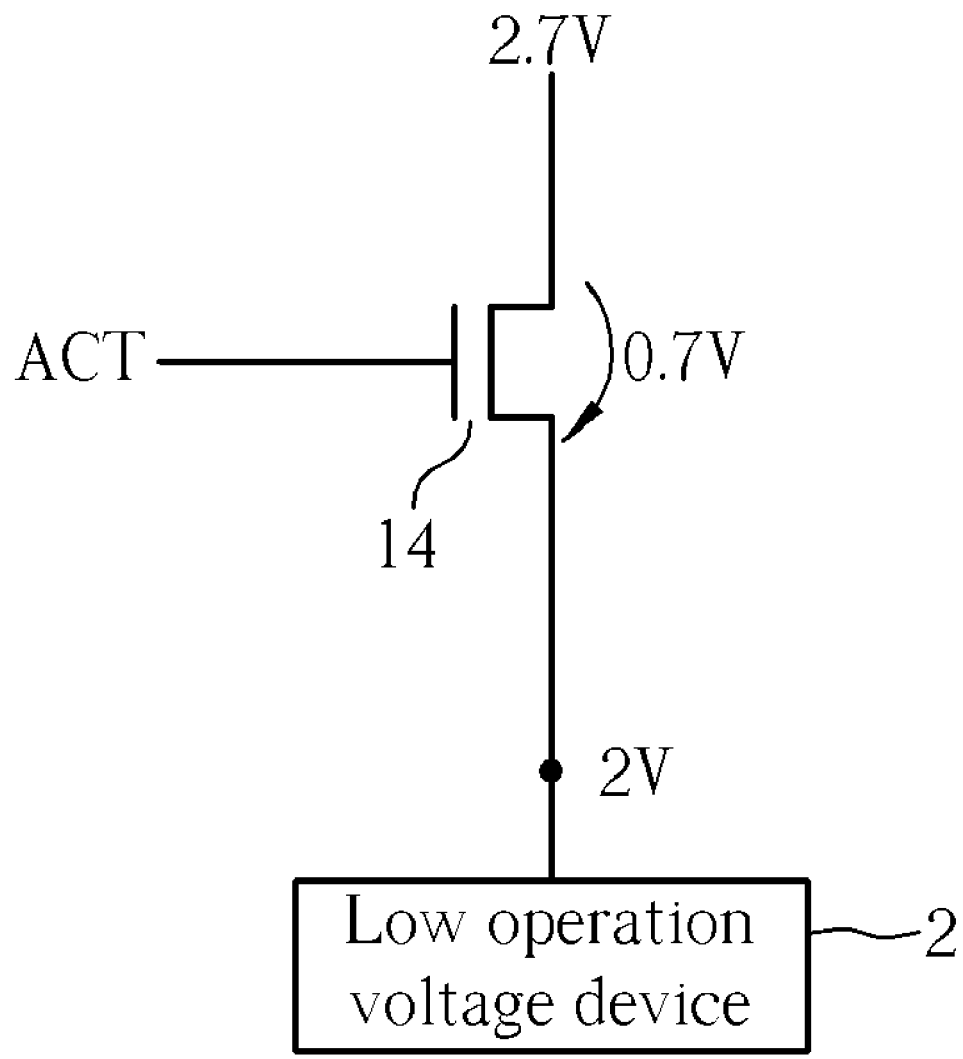
Figure 4:
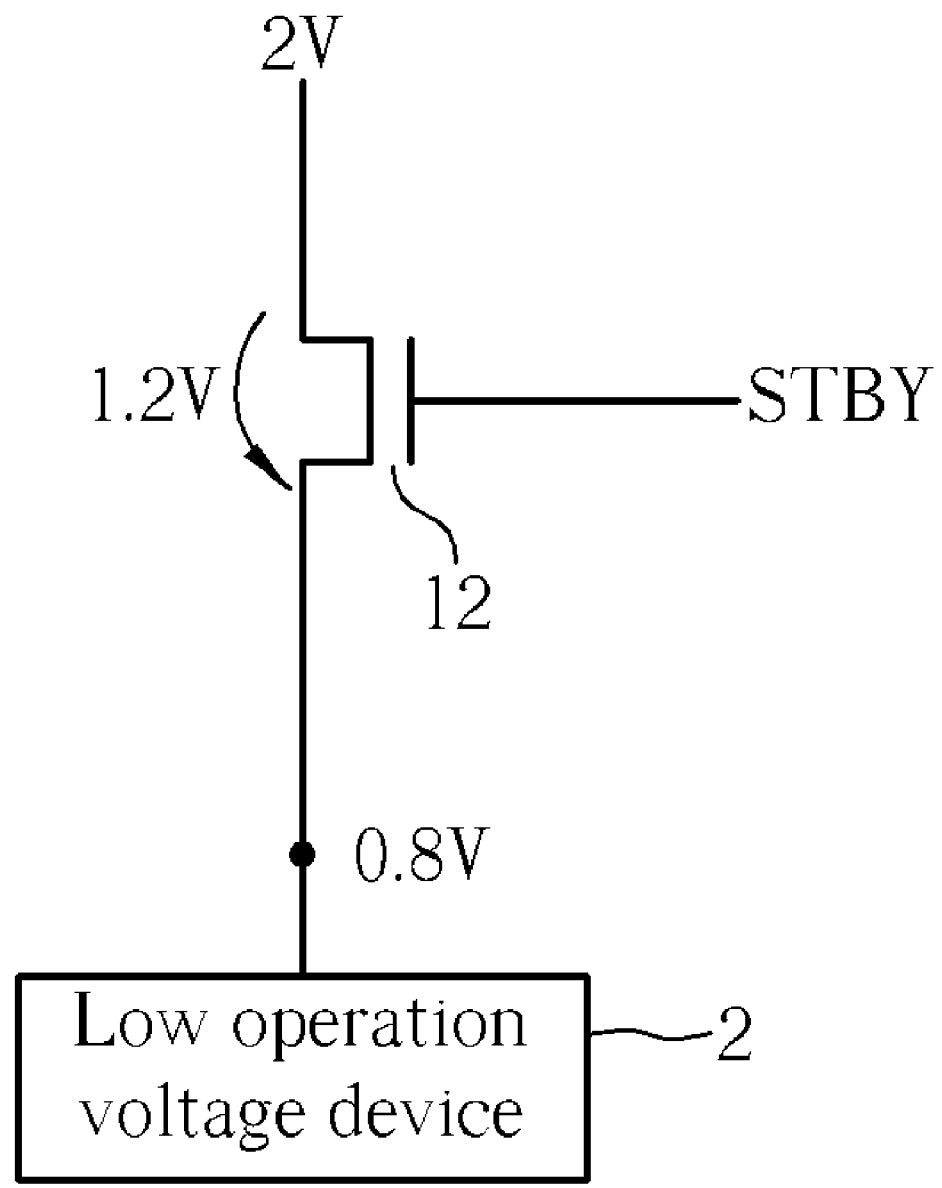
FIG. 4 shows the low operation voltage device idle when the potential of the external power supply of FIG. 1 is decreased to 2 volts.
Figure 12:
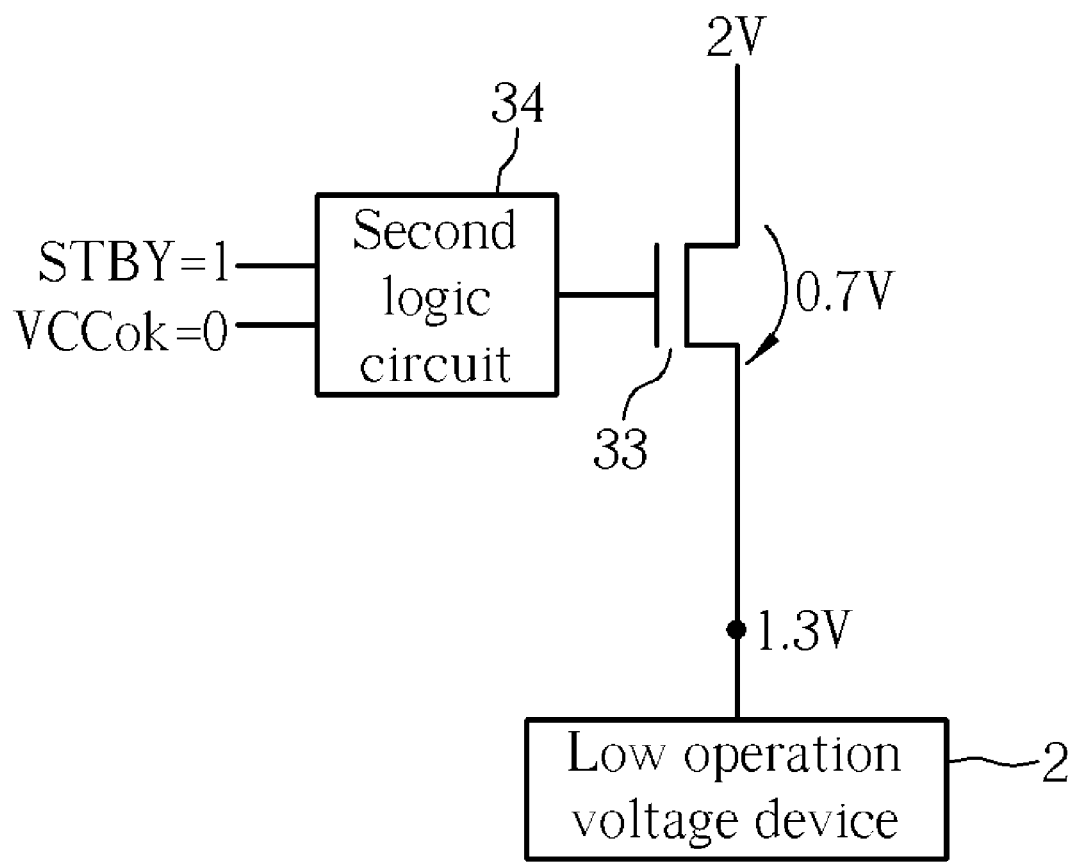
FIG. 12 shows the voltage controller of the present invention providing the voltage to the low operation voltage device when the potential of the external power supply of FIG. 7 is decreased to 2 volts.

Next, please refer to FIG. 12, which shows the voltage controller 3 of the present invention providing the voltage to the low operation voltage device 2 when the potential of the external power supply VCC is decreased to 2 volts, wherein the second logic circuit turns on the second transistor 33 to provide 1.3 volts to the low operation voltage device 2. Compared to FIG. 4, where the potential of the external power supply VCC is also 2 volts and the low operation voltage device 2 is idle, the voltage controller 3 of the present invention provides a larger voltage to the low operation voltage device 2 than the voltage controller 1 of the prior art does. If the potential of the external power supply VCC is gradually decreased, the voltage controller 3 can still provide enough voltage to make the low operation voltage device 2 maintain data. But, in FIG. 4, if the potential of the external power supply VCC is gradually decreased, i.e., smaller than 2 volts, the data cannot be maintained precisely.

Figure 5:
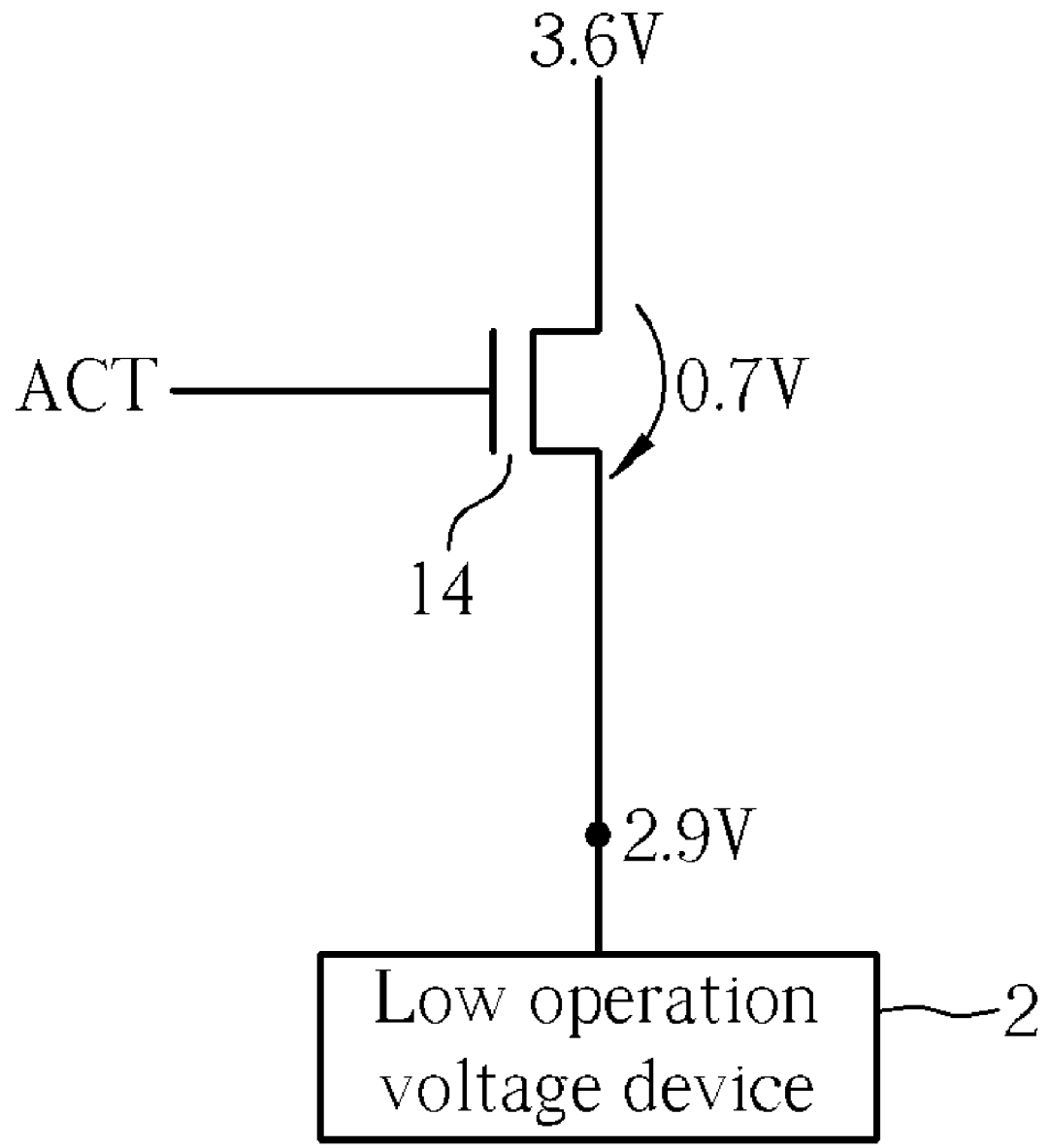
FIG. 5 shows the potential of the external power supply of FIG. 4 increased from 2 volts to 3.6 volts and the operation status entered.
Figure 6:
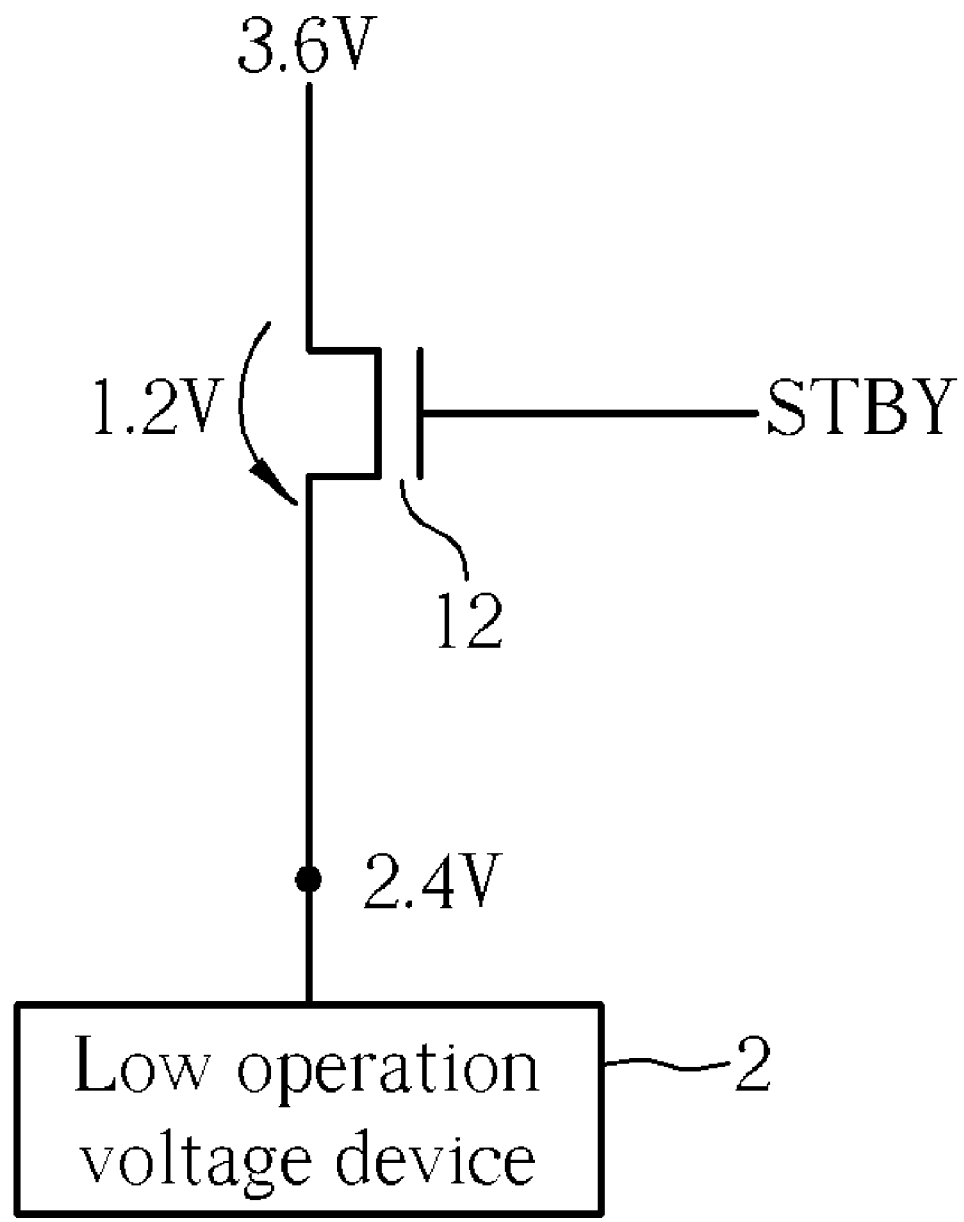
FIG. 6 shows the low operation voltage device idle when the potential of the external power supply of FIG. 1 is 3.6 volts.
Figure 13:
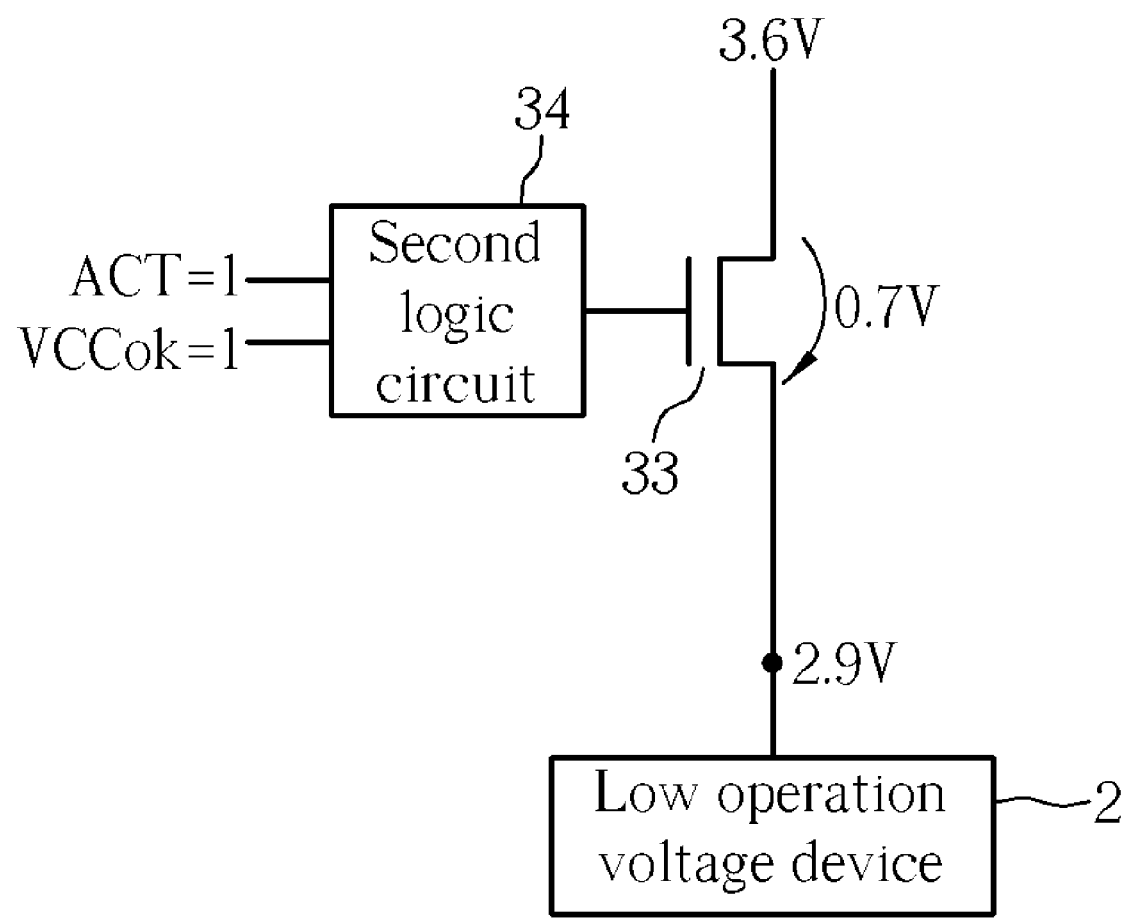
FIG. 13 shows the potential of the external power supply of FIG. 12 increased from 2 volts to 3.6 volts and the operation status entered.

In addition, if the potential of the external power supply VCC is reduced to 2 volts and reading or writing data is still executed, the battery must be changed or be charged. Please refer to FIG. 13, which shows the potential of the external power supply VCC of FIG. 12 increased from 2 volts to 3.6 volts and the operation status entered. The input voltage received by the low operation voltage device 2 is increased from 1.3 volts to 2.9 volts, which does not have to switch the power path and the increasing voltage range is small. Compared to FIG. 5, the present invention can provide voltage to the low operation voltage device 2 sooner to prevent the failure of the first data bit.

Figure 14:
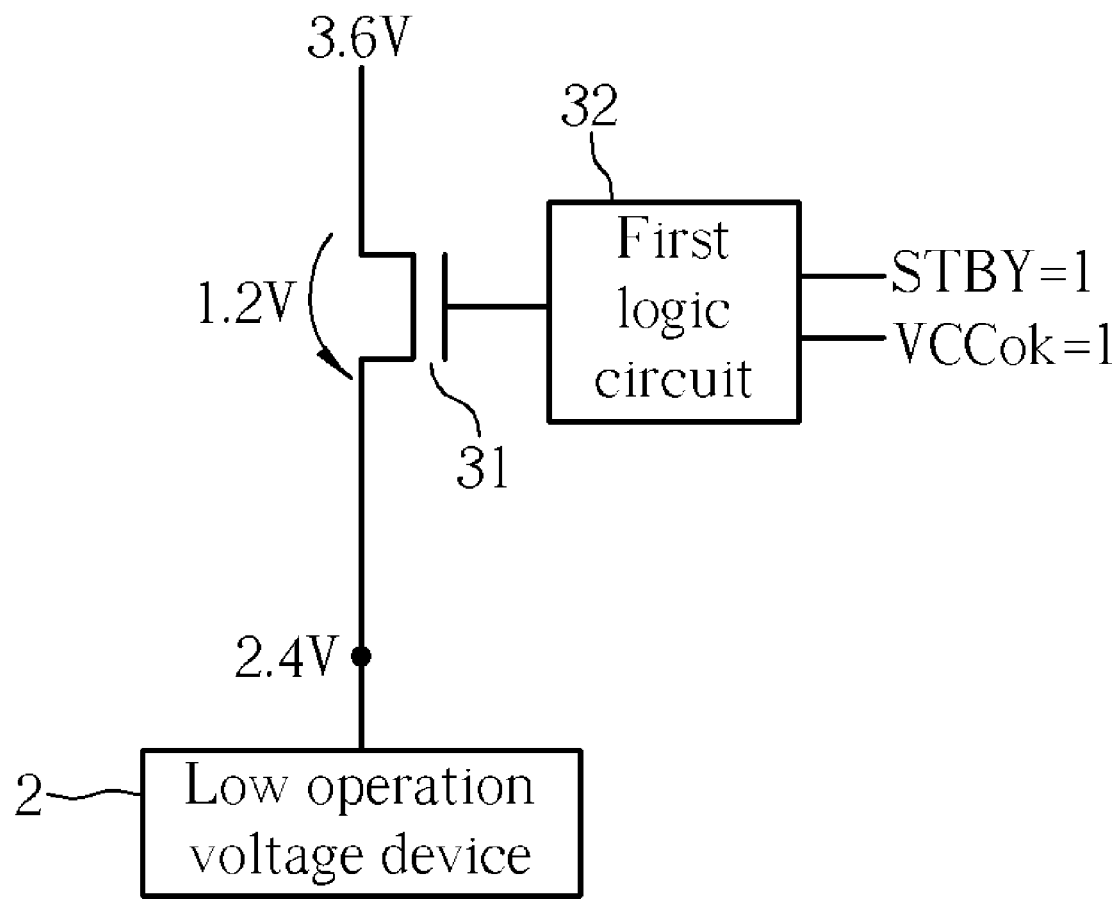
FIG. 14 shows the voltage controller of the present invention providing the voltage to the low operation voltage device when the potential of the external power supply of FIG. 7 is 3.6 volts.

Additionally, please refer to FIG. 14, which shows the voltage controller 3 of the present invention providing the voltage to the low operation voltage device 2 when the potential of the external power supply VCC is 3.6 volts. Since some rules of the memory specification limit the flowing current of the idle status, based on the structure of the voltage controller 3, the present invention can utilize the first transistor with larger threshold voltage, such as 1.5 volts, which can still conform to the rules. In the prior art, if the threshold voltage of the first transistor 12 is increased, when the potential of the external power supply VCC is small and the idle status is entered, the prior art does have the ability to precisely maintain data stored in the low operation voltage device 2 because the voltage controller 1 drops a larger voltage in the idle status. After the smaller potential of the external power supply VCC is dropped, it could not provide the basic voltage, 0.8 volts, to the low operation voltage device 2. However, the present invention drops a smaller voltage when the potential of the external power supply VCC is small and the idle status is entered, increasing the threshold voltage of the first transistor 31 and not affecting data accuracy because the power path is different. Therefore, the transistors of the voltage controller 3 can be designed with a larger threshold voltage.

The present invention considers the potential of the external power supply for switching the power paths, and thereby prevents the failure of the first data bit due to switching power paths in the prior art. In addition, based on the structure and the operation of the voltage controller of the present invention, the threshold voltages of the transistors can be larger than those of the prior art. The present invention can be implemented in an SRAM, a dynamic random access memory (DRAM), a flash memory, or other devices with low operating voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controller comprising:
   a first transistor with a first threshold voltage, the first transistor having a drain coupled to a voltage source and a source coupled to a voltage input of a low operation voltage device;
   a second transistor with a second threshold voltage smaller than the first threshold voltage of the first transistor, the second transistor having a drain coupled to the voltage source and a source coupled to the voltage input of the low operation voltage device;
   a first logic circuit having an output coupled to a gate of the first transistor for turning on the first transistor when the low operation voltage device is idle and a value of the voltage source is larger than a predetermined voltage value; and
   a second logic circuit having an output coupled to a gate of the second transistor for turning on the second transistor when the low operation voltage device is operating or the value of the voltage source is not larger than the predetermined voltage value.

2. The voltage controller of claim 1, wherein the first logic circuit comprises an AND logic gate having a first input for receiving a state signal of the low operation voltage device and a second input for receiving a voltage signal corresponding to the voltage source.

3. The voltage controller of claim 1, wherein the second logic circuit comprises a NAND logic gate having a first input for receiving a state signal of the low operation voltage device and a second input for receiving a voltage signal corresponding to the voltage source.

4. The voltage controller of claim 1, wherein the second logic circuit further comprises:

an inverter having an input for receiving a voltage signal corresponding to the voltage source;

an AND logic gate having a first input for receiving an output signal of the inverter and a second input for receiving a state signal of the low operation voltage device; and an OR logic gate having a first input for receiving an output signal of the AND logic gate, a second input for receiving the state signal of the low operation voltage device, and an output coupled to the gate of the second transistor.

5. The voltage controller of claim 1, wherein the first threshold voltage of the first transistor is within a range of between 1.2 volts and 1.5 volts.

6. The voltage controller of claim 1, wherein the second threshold voltage of the second transistor is about 0.7 volts.

* * * * *